United States Patent [19]

Maeda

[11] Patent Number: 4,900,257
[45] Date of Patent: Feb. 13, 1990

[54] METHOD OF MAKING A POLYCIDE GATE USING A TITANIUM NITRIDE CAPPING LAYER

[75] Inventor: Takeo Maeda, Tokyo, Japan

[73] Assignee: Kabushiki Kaisha Toshiba, Kawasaki, Japan

[21] Appl. No.: 181,392

[22] Filed: Apr. 14, 1988

Related U.S. Application Data

[62] Division of Ser. No. 845,250, Mar. 28, 1986, abandoned.

[30] Foreign Application Priority Data

Mar. 30, 1985 [JP] Japan ................................. 60-67813

[51] Int. Cl.$^4$ ............................................. H01L 21/283
[52] U.S. Cl. ..................................... 437/200; 437/192; 437/246; 437/946; 148/DIG. 15; 148/DIG. 17; 148/DIG. 147
[58] Field of Search ............... 437/192, 190, 195, 200, 437/245, 246, 946, 41, 40; 357/67, 71; 148/DIG. 15, DIG. 19, DIG. 147, DIG. 17

[56] References Cited

U.S. PATENT DOCUMENTS

| | | | |
|---|---|---|---|
| 4,141,022 | 2/1979 | Sigg et al. | 357/23 |
| 4,329,706 | 5/1982 | Crowder et al. | 357/71 |
| 4,472,237 | 9/1984 | DeSlauriers et al. | 156/643 |
| 4,746,219 | 5/1988 | Holloway et al. | 357/23.11 |

FOREIGN PATENT DOCUMENTS 0098963  6/1983  Japan .
82/03948 11/1982  PCT Int'l Appl. .

OTHER PUBLICATIONS

Tsai et al., *J. Electrochem. Soc.*, vol. 128, No. 10, Oct. 1981, pp. 2207–2214.

*Primary Examiner*—Brian E. Hearn
*Assistant Examiner*—T. N. Quach
*Attorney, Agent, or Firm*—Foley & Lardner, Schwartz, Jeffery, Schwaab, Mack, Blumenthal & Evans

[57] ABSTRACT

A semiconductor device has a multilayer comprising a refractory metal silicide and a metal nitride on a silicon layer. The metal nitride prevents the silicon layer from being oxidized so that a good ohmic contact is obtained. A method of manufacturing the semiconductor device comprises steps of forming a polysilicon layer, implanting impurity ions into the polysilicon, removing a self oxidation film from the polysilicon layer, sequentially forming refractory metal and its nitride, patterning, and silicifying the metal. The method provides a semiconductor device having a good ohmic contact, a reduced resistivity of interconnections and high reliability.

9 Claims, 2 Drawing Sheets

METHOD OF MAKING A POLYCIDE GATE USING A TITANIUM NITRIDE CAPPING LAYER

This application is a division of application Ser. No. 845,250, filed Mar. 28, 1986, now abandoned.

BACKGROUND OF THE INVENTION

1. Field of the Invention

The present invention relates to a semiconductor device and a method of manufacturing the same.

2. Description of the Prior Art

An impurity doped polysilicon layer is commonly used in a MOS type semiconductor device as its gate electrodes and interconnection layers. A so-called polycide construction consisting of a layer of metal or metal silicide over a layer of polysilicon is sometimes incorporated to reduce the resistivity of polysilicon.

FIG. 1 is a cross-sectional view showing the vertical cross section of a MOS type semiconductor device having such a polycide construction. In the figure, a gate electrode 7 is formed on a gate oxide 3 in the central active region surrounded by a thick field oxide 2 for isolation, the gate electrode 7 being formed of a multilayer consisting of a polysilicon layer 4 with doped impurities and a metal silicide layer 5. In the semiconductor substrate 1 at the periphery of the gate electrode 7, source and drain regions 8, i.e., diffusion regions with impurities highly doped through a gate oxide layer 3, are formed.

The metal silicide 5 of the gate electrode 7 is a silicide of metal having a high melting point refractory and is, for example, titanium silicide, molybdenum silicide and so on. The metal silicide 5, together with the impurity doped polysilicon layer 4, contributes to the reduction of a specific resistivity and hence the improvement of conductivity.

Metal or metal silicide formed on the gate electrode is however directly exposed to an atmosphere during semiconductor manufacturing processes so that it is oxidized to form an oxide layer 6 or it is etched to prevent a reduction of resistivity.

In particular, metal or metal silicide absorbs oxygen in the atmosphere and is oxidized during the manufacturing processes, thus forming an oxide layer on the surface thereof. FIG. 3 is a cross section showing a semiconductor device in which an interconnection layer made of a multilayer consisting of a polysilicon layer 4 and of a metal silicide layer 5 is formed with an oxide layer 6, and an aluminum interconnection 10 is formed at a contact hole after an insulation layer 9 is deposited upon the oxide layer 6. In this case, an ohmic contact is hindered due to the presence of the insulating oxide layer 6 at B between the aluminum interconnection 10 and the metal silicide layer 5.

As a result, the oxide layer at the contact hole has to be removed and is subjected to a reactive process with hydrofluoric acid after the reactive ion etching (RIE) process for opening the contact hole.

However, the metal oxide and metal silicide are prone to be etched with hydrofluoric acid. Thus, without a proper etching control, not only the metal oxide layer 6, but also the metal silicide 5 is etched as shown at A of FIG. 2 so that a reduction of resistivity cannot be achieved.

Furthermore, a conventional metal silicide layer as of a polycide construction involves a problem in that it has a large residual stress and a stepped portion thereof is apt to be cut.

SUMMARY OF THE INVENTION

It is an object of the present invention to provide a semiconductor device and a method of manufacturing the same wherein the resistivity of gate electrodes and interconnections can be reduced.

It is another object of the present invention to provide a semiconductor device and a method of manufacturing the same wherein good ohmic contacts of metal interconnections can be obtained.

It is a further object of the present invention to provide a semiconductor device and a method of manufacturing the same wherein a stepped portion of an interconnection is scarcely cut and the semiconductor device is highly reliable.

In the semiconductor device of the present invention, a silicified layer of a refractory metal and a nitrified layer of the same or other refractory metal are formed upon a silicon substrate or a deposited silicon layer.

In the method of manufacturing the semiconductor device of the present invention, a polysilicon layer is formed on a silicon substrate; impurity ions are implanted and diffused; a self oxidation layer formed on the polysilicon layer is removed after diffusion; a metal layer of a high melting point and a nitrified layer of the same or other refractory metal are sequentially formed on the polysilicon layer after removal of the self oxidation layer; the thus obtained multilayer is patterned in a determined shape; and the metal layer is silicified by heating.

DESCRIPTION OF THE PREFERRED EMBODIMENT

Figure 4:
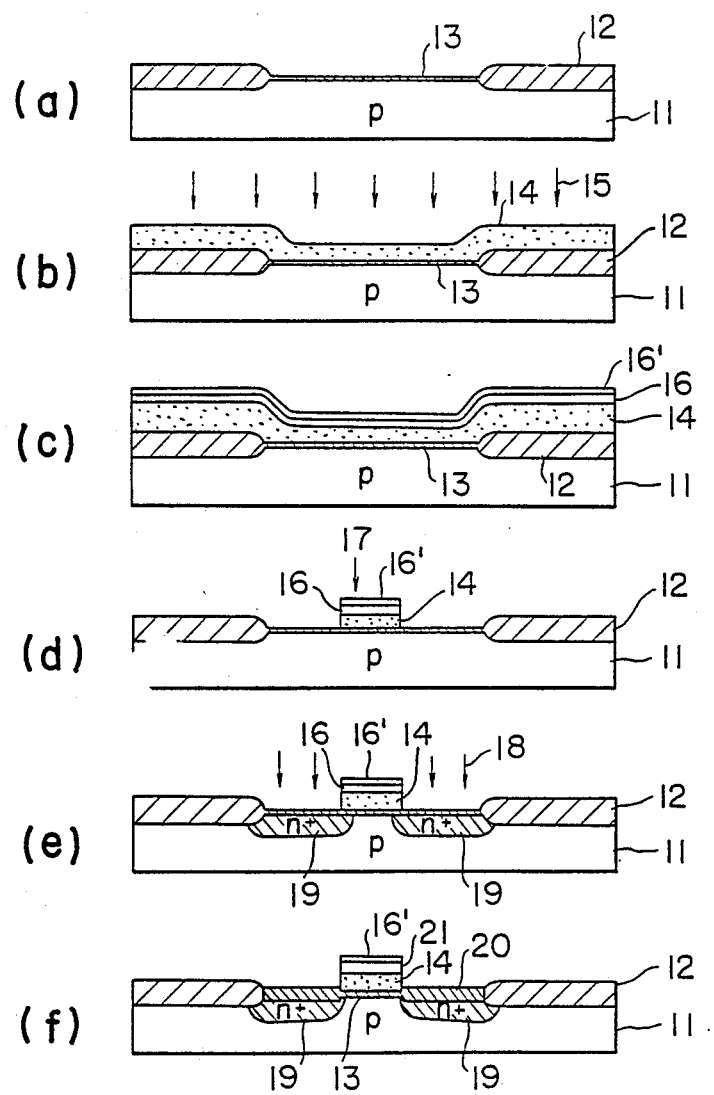
FIGS. 4(a) to 4(f) are cross-sectional views of a semiconductor device showing the processes of the manufacturing method according to the present invention.

FIG. 4(f) is a cross-sectional view showing an example of the construction of the semiconductor device according to the present invention.

Figure 1:
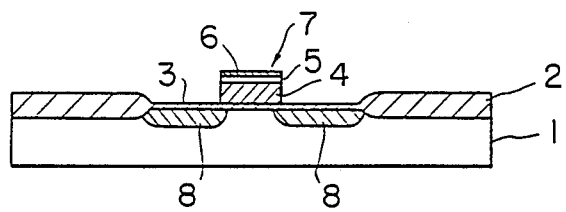
FIG. 1 is a cross-sectional view showing a conventional semiconductor device construction.
Figure 2:
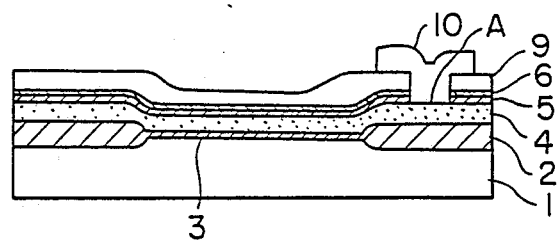
FIGS. 2 and 3 are cross-sectional views for explaining the problems associated with a conventional semiconductor device.
Figure 3:
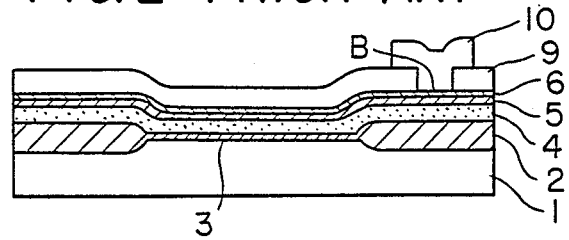
Figure 5:
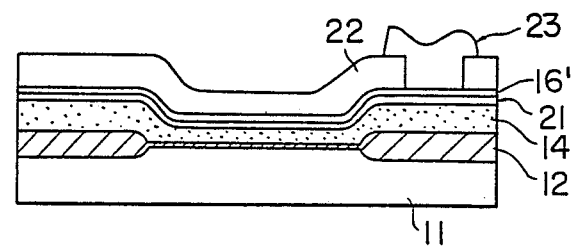
FIG. 5 is a cross-sectional view for explaining the operation and effect of the semiconductor device of the present invention.

In the figure, a gate electrode and highly doped impurity diffusing regions are shown formed in the semiconductor. The gate electrode is formed on the central region surrounded by a field oxide layer 12 and constructed of a multilayer made of a gate oxide layer 13, impurity doped polysilicon layer 14, titanium silicide layer 21, and titanium nitride layer 16'. The highly doped impurity diffusing regions 19 are formed in a semiconductor substrate 11 on opposite sides of the gate electrode. Titanium nitride is chemically stable and oxidation scarcely occurs so that a good contact performance can be attained between titanium nitride and a metal interconnection to be formed thereupon. FIG. 5 is a cross-sectional view showing an example of the semiconductor device with such an interconnection, wherein a contact hole is formed facing a local area of the polysilicon layer 14 serving as an interconnection. In the figure, the titanium silicide layer 21 and titanium nitride layer 16' as of FIG. 4(f) are formed on the impurity doped interconnection polysilicon layer 14. The titanium silicide layer 21 contributes to the reduction of resistivity of the interconnection layer 14. Upon the two layers 21 and 16' a silicon dioxide insulation layer 22 with the contact hole locally provided therein is formed. An aluminum interconnection layer 23 is formed for electrical connection at the contact hole. Since an oxidation film is not generated on the upper surface of the titanium nitride layer 21, a good ohmic contact of the aluminum interconnection can be obtained.

Next, the processes of manufacturing the semiconductor device as above will be described with reference to FIGS. 4(a) to 4(e).

Assuming here that a semiconductor device to be manufactured is of an n-channel MOS transistor, on a p-type substrate 11 having a specific resistivity of 0.1 to 10 cm, a thick field oxide layer 12 for isolation of devices is formed by means of such as a selective oxidation method. In the active regions, a gate oxidation layer 13 is formed having a layer thickness of 100 to 200 Å (FIG. 4(a)).

Next, after implanting ions into the active regions to form a channel, a polysilicon layer 12 is deposited over the whole surface of the substrate by means of a low pressure CVD (LPCVD) method until the layer thickness becomes 1000 to 3000 Å. To make the polysilicon layer conductive, arsenic ion 15 is implanted therein at an acceleration voltage of 40 Kev and at a dose of $5 \times 10^{14}$ to $5 \times 10^{15}$ cm$^{-2}$, and thereafter activation by heating is performed (FIG. 4(b)). In this case, the layer thickness of the polysilicon layer can be thinned as compared with a conventional one. The reason for this is that a metal layer of a high melting point to be formed at the next process serves, during non-implantation for forming the source and drain regions, as a suitable mask for preventing ions from implanting under the gate electrode.

Next, a self-oxidation film formed on the surface of the polysilicon layer 14 is removed by means of argon sputter etching. Under the same atmosphere, a titanium layer 16 which is a high melting point metal and a titanium nitride (TiN) layer 16' are sequentially formed by means of sputtering and reactive sputtering, respectively, to obtain layers of 100 to 1000 Å thick (FIG. 4(c)).

Next, the polysilicon layer 14, titanium layer 16, and titanium nitride layer 16' are patterned by means of photolithographic process to form a gate electrode 17 (FIG. 4(d)).

Succeedingly, to form highly doped impurity diffusing regions serving to source and drain regions, arsenic 18 is ion-implanted at an acceleration voltage of 40 KeV and at a dose of $1 \times 10^{15}$ to $5 \times 10^{15}$ cm$^{-2}$ and is subjected to diffusion to thereby obtain source and drain regions 19 (FIG. 4(e)).

Further, under an oxygen atmosphere heated up to 850° to 950° C., a heat treatment is conducted so that the oxidation layers above the source and drain regions 19 become thick to form oxidation layers 20. As a result, the breakdown voltage of the gate becomes high, and silicon atoms in the polysilicon 14 move into the titanium layer 16 to change it to a titanium silicide layer 21.

Thereafter as shown in FIG. 5, the insulation layer 22, aluminum interconnection 23 and so on are formed to fabricate a semiconductor device.

The resistance value of the interconnection layer of the semiconductor device manufactured in the above embodiment was $1\Omega/\square$ as compared with $10\Omega/\square$ of a conventional device without a nitride layer. Furthermore, with a 1 μm square contact hole formed on the interconnection layer, a contact resistance of the polysilicon interconnection layer of the present invention was $10\Omega$ as compared with a conventional resistance of $1K\Omega$.

Furthermore, although the stress of the metal silicide in the conventional polycide arrangement was $2 \times 10^{10}$ dyne/cm$^2$, the nitride layer in the present invention is about $5 \times 10^9$ dyne/cm$^2$ which is about one fourth of the conventional one.

In the above embodiment, although the description has been directed to an n-channel MOS transistor, a p-channel MOS semiconductor device or a CMOS semiconductor device is also applicable.

Also, metal titanium and titanium nitride have been used in the embodiment, another metal of a high melting point other than titanium may be used, for example, molybdenum, tantalum, tungsten, cobalt, nickel, or palladium. In this case, a high melting point metal which is silicified may be the same as that nitrified, and may be different from that nitrified.

In the embodiment, the invention has been described in association with the gate electrode. However, the metal layer of a high melting point according to the present invention may be formed on the silicon substrate itself or the second polysilicon interconnection layer.

Also, in the manufacturing method, various modifications are possible using other processes commonly practiced in the art. In particular, implantation of ions into a polysilicon layer may be performed after deposition of a refractory metal layer; both conduction types may be used as the impurities to be doped into polysilicon irrespective of the conduction type of a semiconductor device; instead of depositing a refractory metal layer, a metal silicide layer may be deposited from the beginning; and the metal nitride layer may be removed after patterning or silicifying by means of chemical etching using a mixture of sulfuric acid and hydrogen peroxide to remove residual stress in the metal nitride layer which is apt to generate a warp in a substrate.

As described above, according to the present invention, a silicide layer of a refractory metal and a nitride layer of the same metal scarcely subjected to oxidization are formed on a silicon layer, so that an oxidized layer is not formed on the surface of the nitride layer to thereby realize a good ohmic contact. In addition, the nitride layer is not damaged under the reactive process after forming contact holes so that a stable ohmic contact is maintained.

Furthermore, since the metal layer is formed after removal of the self oxidation film on the silicon layer, silicifying is easy and therefore a reduction of resistivity of interconnections is readily attained.

Furthermore, the nitride layer of a refractory metal has a lower stress as compared with a conventional metal silicide, so that a stepping portion of an interconnection is scarcely cut. Thus, reliability is improved and the resistance value of an interconnection can be lowered.

What is claimed is:

1. A method of manufacturing a semiconductor device comprising the steps of:
   forming a polysilicon layer on a silicon substrate through a gate oxide film;
   implanting impurity ions into said polysilicon layer and diffusing said impurity ions;
   removing a self oxidation film formed on said polysilicon layer after diffusing said impurity ions;
   sequentially forming, on said polysilicon layer with said self oxidation film removed, a refractory metal layer and a nitride layer of the refractory metal;
   patterning said polysilicon layer, said refractory metal layer and said nitride layer of the refractory metal into a desired shape;
   silicifying said refractory metal layer through a heat process; and
   removing said nitride layer after said silicifying.

2. A manufacturing method according to claim 1, wherein said patterning step is a process for patterning a gate electrode.

3. A manufacturing method according to claim 1, wherein said patterning step is a process for patterning an interconnection.

4. A manufacturing method according to claim 1, wherein said step for removing said self oxidation layer is performed by sputter etching.

5. A method of manufacturing a semiconductor device comprising the steps of:
   forming a polysilicon layer on a silicon substrate through a gate oxide film;
   implanting impurity ions into said polysilicon layer and diffusing said impurity ions;
   removing a self oxidation film formed on said polysilicon layer after diffusing said impurity ions;
   sequentially forming, on said polysilicon layer with said self oxidation film removed, a silicified layer of a refractory metal and a nitride layer of the refractory metal;
   patterning said polysilicon layer, said silicified layer of the refractory metal and said nitride layer of the refractory metal into a desired shape; and
   removing said nitride layer after said patterning.

6. A manufacturing method according to claim 5, wherein said patterning step is a process for patterning a gate electrode.

7. A manufacturing method according to claim 5, wherein said patterning step is a process for patterning an interconnection.

8. A manufacturing method according to claim 5, wherein said step for removing said self oxidation layer is performed by sputter etching.

9. A manufacturing method according to claim 1, wherein said refractory metal layer is formed thinner than said polysilicon layer.

* * * * *